United States Patent [19]

Takayama

[11] 4,072,897
[45] Feb. 7, 1978

[54] EQUIVALENT LOAD-PULL CHARACTERIZATION OF MICROWAVE TRANSISTORS

[75] Inventor: Yoichiro Takayama, Tokyo, Japan

[73] Assignee: Nippon Electric Co., Ltd., Tokyo, Japan

[21] Appl. No.: 734,422

[22] Filed: Oct. 21, 1976

[30] Foreign Application Priority Data

Oct. 23, 1975 Japan .................................. 50-127673

[51] Int. Cl.² ...................... G01R 31/22; G01R 27/04
[52] U.S. Cl. ................................ 324/158 T; 324/58 B
[58] Field of Search .......... 324/158 T, 158 D, 58.5 B, 324/51, 158 R, 58 B, 58 R, 58 A

[56] References Cited

U.S. PATENT DOCUMENTS 3,789,301  1/1974  Malaviya .......................... 324/158 T Primary Examiner—Rudolph V. Rolinec
Assistant Examiner—Ernest F. Karlsen

[57] ABSTRACT

By simultaneously supplying input and output terminals of a microwave transistor with input and incident signals from a divided (branched) microwave signal, equivalent load-pull characterization is carried out without using an output impedance tuner. The amplitude and phase of the incident signal may be varied to equivalently vary the admittance or impedance looking into the output terminals on the entire admittance or impedance plane.

4 Claims, 2 Drawing Figures 4,072,897

EQUIVALENT LOAD-PULL CHARACTERIZATION OF MICROWAVE TRANSISTORS

BACKGROUND OF THE INVENTION

This invention relates to a method and an apparatus for measuring load characteristics of a microwave transistor, particularly, a microwave power transistor.

It is essential to know the large-signal characteristics of the transistors to estimate microwave transistor elements and design circuits for microwave transistors. Being dependent on the input signal level and load, large-signal characterization of large-signal power transistors is difficult compared with characterization of linear, small-signal transistors. S-parameter characterization, adequate for a small-signal element, is not always effective for a large-signal element. Consequently, characteristics of a large-signal element are generally measured by the use of a method known as load-pull characterization wherein the relation between load impedance and output power is measured with the load varied by the use of an output impedance tuner. With this method, it is indispensable to measure the load impedance at every point of measurement by disconnecting the tuner. Reconnection of the tuner is not sufficiently reproducible and unavoidably offers a problem of precision. When the tuner is calibrated beforehand, another problem arises in that the mechanism of the tuner is inadequate to reliably reproducing the impedance. For higher-frequency power transistors, which inevitably have low input and output impedances, it becomes more difficult to manufacture a low-loss output impedance tuner with excellent impedance reproducibility. Measurement of the load characteristic thus poses various problems, particularly, for low-impedance microwave power transistors.

SUMMARY OF THE INVENTION

It is therefore an object of the present invention to provide a method and an apparatus for measuring load characteristics of microwave transistors with excellent reproducibility and high precision.

It is another object of this invention to provide a method and an apparatus for equivalently carrying out load-pull characterization of microwave power transistors without using an output impedance tuner.

In accordance with this invention there is provided a method for measuring load characteristics of a microwave transistor by the use of a microwave signal. The transistor has an input and an output terminal pair. The method comprises the steps of splitting a first and a second signal from the microwave signal, adjusting the amplitude and phase of the second signal to provide an adjusted signal, supplying the first and adjusted signals simultaneously to the input and output terminal pairs, respectively, to make the transistor produce a reflected signal across the output terminal pair, and measuring at least one of an impedance looking into the output terminal pair, a sign-reversed value of the impedance, an admittance looking into the output terminal pair, a sign-reversed value of the admittance, a reflection coefficient looking into the output terminal pair, and an inverse number of the reflection coefficient. By simultaneously measuring electric power of the adjusted and/or reflected signals, it is possible to provide load characteristics related with output or incident power.

According to this invention there is also provided an equipment arrangement for measuring load characteristics of a microwave transistor by the use of a microwave signal. The transistor has an input and an output terminal pair. The arrangement comprises means for branching a first and a second signal of the same specified frequency from the microwave signal, means for supplying the first signal to the input terminal pair, means for adjusting the amplitude and phase of the second signal to produce an adjusted signal, a measuring instrument, and means for supplying the adjusted signal to the output terminal pair through the measuring instrument simultaneously with application of the first signal to the input terminal pair to make the transistor produce a reflected signal across the output terminal pair. The measuring instrument is capable of measuring the adjusted and reflected signals to calculate at least one of an impedance looking into the output terminal pair, a sign-reversed value of the impedance, an admittance looking into the output terminal pair, its sign-reversed value, a reflection coefficient looking into the output terminal pair, and an inverse value of the reflection coefficient, and also of measuring powers of the adjusted and/or reflected signals.

DESCRIPTION OF THE PREFERRED EMBODIMENT

Figure 1:
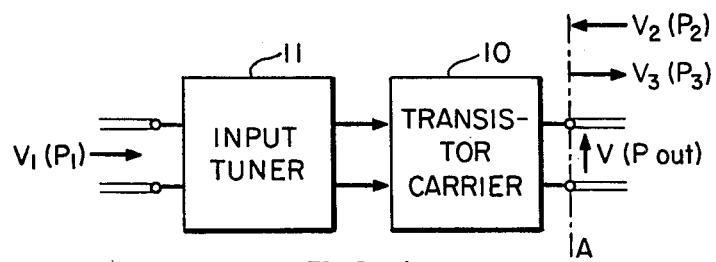
FIG. 1 is a block diagram of a basic network illustrating the principles of a method according to the present invention.

Referring now to FIG. 1 there is shown in illustrative block diagram form of a basic network for carrying out a method according to the present invention. The network includes microwave transistor mounted on a test transistor carrier 10. The carrier 10 may comprise strip lines, coaxial lines, or like transmission lines of a characteristic impedance $Z_0$ (usually, fifty ohms), and is used for convenience in mounting a transistor in place to provide input and output ports therefor. The carrier 10 may therefore be deemed to represent a microwave transistor, which may be a bipolar transistor or a field-effect transistor. An input tuner network 11 is connected between the input port transmission lines and a pair of input terminals of the transistor. A pair of transistor output terminals, such as the collector electrodes of a grounded-base bipolar transistor or the drain-source electrodes of a field-effect transistor, may be wire-bonded to the output port transmission lines. The points of connection will be referred to as an output reference plane A. A measuring instrument (not depicted in FIG. 1), such as a network analyser, is connected to the output port transmission lines. Circuits (not shown in FIG. 1) are connected to the input and output ports to supply bias and power to the test transistor.

An input signal $V_1$ of an input power $P_1$ and of a specified microwave frequency $f$ is supplied to the transistor input terminals through the input tuner network 11. An incident signal $V_2$ of an incident power $P_2$ and of the frequency $f$ is forcibly simultaneously supplied to the transistor output terminals or the output reference plane A through the measuring instrument. The transistor produces an output or reflected signal $V_3$ of a reflected power $P_3$ from the reference plane A. So long as the incident signal $V_2$ is kept at zero, the output load impedance of the transistor is equal to the characteristic impedance $Z_0$. When the incident signal $V_2$ is forced to the reference plane A, a variation occurs in an output terminal voltage V or current to introduce, in turn, a variation in an output power $P_{out}$ produced by the transistor.

Now, the incident signal $V_2$ and reflected signal $V_3$ at the reference plane A may be defined to be:

$$V_2 = \tilde{V}_2 e^{j\omega t} \quad (1)$$

and $$V_3 = \tilde{V}_3 e^{j(\omega t + \alpha)}, \quad (2)$$

and $\tilde{V}_2$ and $\tilde{V}_3$ represent the magnitudes of the respective signals $V_2$ and $V_3$. When the input signal $V_1$ is present, a reflection coefficient $\Gamma_T$ looking into the transistor output given by:

$$\Gamma_T = (V_3/V_2) = (Y_O - Y_T)/(Y_O + Y_T), \quad (3)$$

where $Y_O$ represents the characteristic admittance, equal to $Z_O^{-1}$, and $Y_T$ represents a dynamic admittance looking into the transistor output. At this moment, an equivalent reflection coefficient $\Gamma_L$ looking from the reference plane A towards the load is given by:

$$\Gamma_L = (V_2/V_3) = (Y_O - Y_L)/(Y_O + Y_L), \quad (4)$$

where $Y_L$ represents an output load admittance looking from the reference plane A towards the load and is equal to $-Y_T$. In as much as one of the admittances is equal to a sign-reversed value of the other, one of the reflection coefficients is equal to an inverse number or value of the other. Since the output terminal voltage V is given by $V = V_2 + V_3$ and therefore by using the equation (3), it can be expressed as:

$$V = 2Y_O/(Y_O + Y_T) \cdot V_2 \quad (5)$$

This equation (5) indicates that the ac terminal voltage of the transistor output varies according to the incident signal $V_2$ delivered into the output terminal. The incident and reflected powers $P_2$ and $P_3$ are given by:

$$P_2 = \tfrac{1}{2} Y_O \tilde{V}_2^2 \quad$$

and $$P_3 = \tfrac{1}{2} Y_O \tilde{V}_3^2, \quad (6)$$

and therefore, the output power $P_{out}$ of the transistor is given by:

$$P_{out} = P_3 - P_2 = \tfrac{1}{2} G_L \tilde{V}^2, \quad (7)$$

where $G_L$ represents the real part of the output load admittance $Y_L (Y_U = G_L + jB_L)$ and $\tilde{V}$ the magnitude of the output terminal voltage V.

From the relationship between the dynamic admittance $Y_T$ and the output load admittance $Y_L$ of $$Y_T = -Y_L, \quad (8)$$

the equation (5) can be changed to:

$$Y_L = (1 - 2V_2/V) Y_O \quad (9)$$

As seen from this equation (9), when the incident signal $V_2$ is kept at zero, the output load admittance $Y_L$ of the transistor is equal to the characteristic admittance $Y_O$ and hence, the output load impedance $Z_L (= Y_L^{-1})$ is equal to the characteristic impedance $Z_O (= Y_O^{-1})$. When the incident signal $V_2$ is forced to the reference plane A, the output load admittance $Y_L$ and hence the output load impedance $(Y_L^{-1})$ of the transistor is thus equivalently varied from the characteristic admittance $Y_O$ and the characteristic impedance $Z_O$ to an equivalent load admittance $Y_L$ and load impedance $Z_L (= Y_L^{-1})$, respectively. It is now understood that the load characteristics of a microwave transistor are available without using an objectionable output impedance tuner. As seen from equation (7), the transistor output power $P_{out}$ is obtained by measuring the incidence power $P_2$ and the reflected power $P_3$, or by calculating from the equivalent load admittance $G_L$ and $\tilde{V}$ which in turn is calculated from the equations (7) and (9) by use of the measured values of $P_2$ and $Y_L$. According to the invention, both input and output ports of a test transistor are simultaneously driven by external signals at a specified frequency. This procedure realizes equivalent variation of the transistor load on the whole impedance plane.

Figure 2:
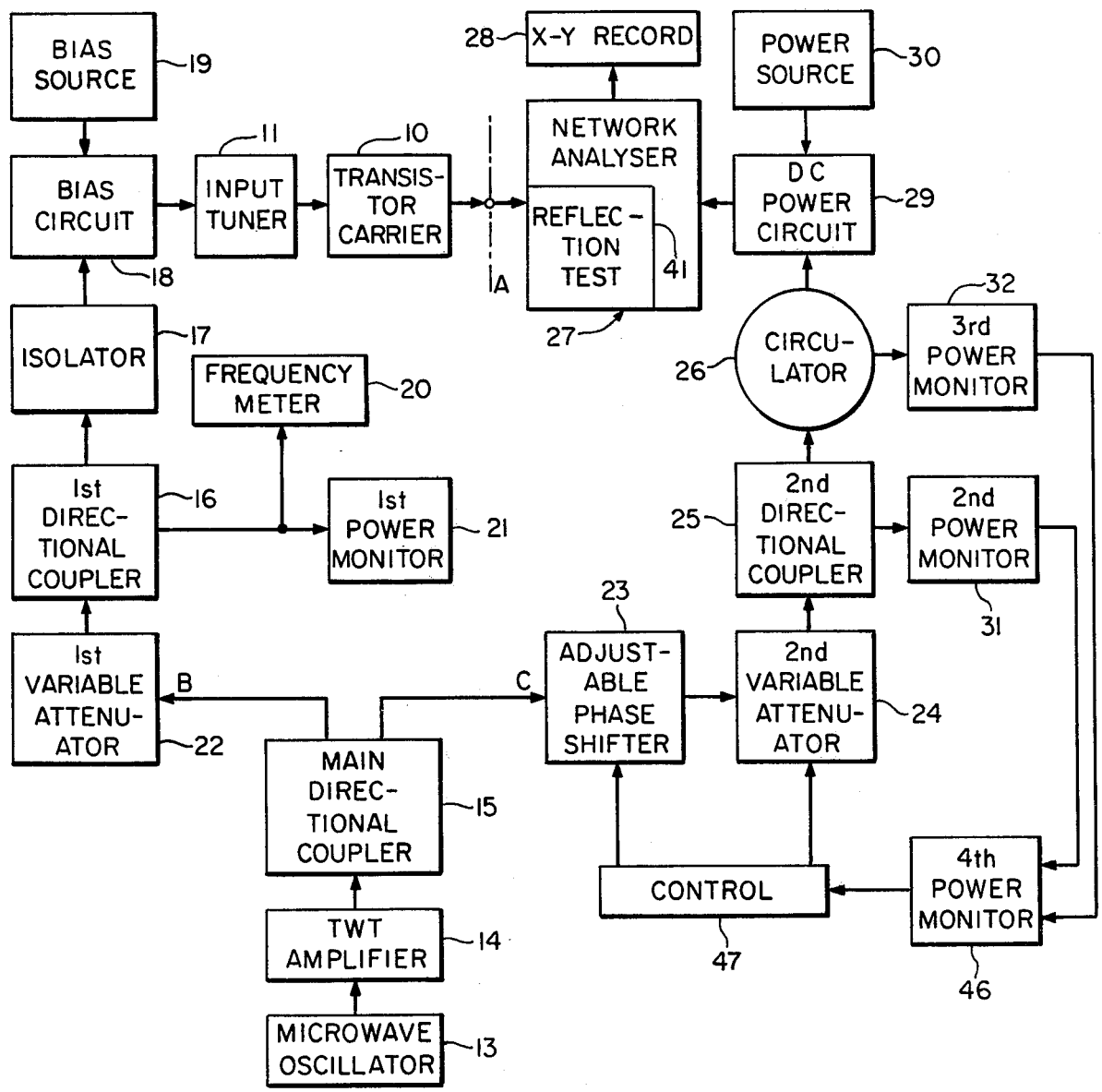
FIG. 2 is a block diagram of apparatus according to an embodiment of this invention.

Referring now to FIG. 2 an apparatus according to an embodiment of this invention comprises a test transistor carrier 10 having a test microwave transistor mounted thereon, an input tuner network 11, and a pair of output terminals of the transistor represented by an output reference plane A as described in conjunction with the basic principles of this invention with reference to FIG. 1. For providing an input signal $V_1$ of an input power $P_1$ and of a specified microwave frequency $f$ and an incident signal $V_2$ of an incident power $P_2$ and of the frequency $f$, a microwave oscillation or signal produced at the frequency $f$ by an oscillator 13 is divided, after amplified by a travelling-wave tube amplifier 14, into first and second signals B and C by a 3-dB main directional coupler 15. As will readily be understood, the oscillator 13 is not an essential element of a measuring apparatus according to this invention. As described hereinabove, the transistor produces a reflected signal $V_3$ of a reflected power $P_3$ at the output reference plane A.

The first signal B is delivered to the transistor as the input signal $V_1$ through a combination of a first directional coupler 16 and an isolator 17 for branching a first test signal from the signal B and thereafter through a first biassing circuit 18 for supplying a first d.c. bias to the transistor input terminals from a first d.c. source 19. By the use of the first test signal, the frequency $f$ is monitored by a frequency meter 20 while the input power $P_1$ for the transistor is measured by a first power monitor 21. In order to adjust the input power $P_1$, a first variable attenuator 22 is interposed between the main and first directional couplers 15 and 16. The power $P_1$ may be set at a specified value, such as about 100 mW.

The second signal C is supplied to the output reference plane A through an adjustable phase shifter 23, a second variable attenuator 24, a second directional coupler 25 for branching a second test signal, first and second ports of a circulator 26, and an impedance measuring instrument 27. The incident signal $V_2$ is thus given by an adjusted signal derived from the second signal C. As described hereinabove, the measuring instrument 27 may be a network analyser. Alternatively, the instrument 27 may be an impedance direct reader. In any event, the instrument 27 measures the output load characteristics of the test transistor. An X-Y recorder 28 may be connected to the measuring instrument 27 for convenience of recording the results of measurement. A second biasing circuit 29 is interposed between the circulator 26 and the measuring instrument 27 to supply a second d.c. bias or power to the transistor output terminals from a second d.c. source 30. The incident power $P_2$ is measured by the use of the second test signal by a second power monitor 31 connected to the second directional coupler 25. A third power monitor 32 is connected to a third port of the circulator 26 for measurement of the reflected power $P_3$. A low-pass filter or band-pass filter may be inserted between the transistor carrier 10 and the network analyzer 27 in order to avoid harmonics.

The equivalent load admittance $Y_L = -Y_T$, equivalent load impedance $Z_L = -Z_T$, or equivalent reflection coefficient $\Gamma_L$ is directly measured by applying the incident and reflected signals $V_2$ and $V_3$ to the test and reference channels of the network analyser 27, respectively, that is, by making the reflected signal $V_3$ the reference signal for the analyser, while the dynamic admittance $Y_T$, impedance $Z_T$ and reflection coefficient $\Gamma_T$ may be directly measured by supplying the signals $V_2$ and $V_3$ to the network analyser channels in the reversed manner. The separation of the incident and reflected signals $V_2$ and $V_3$ is performed by a reflection test unit 41 comprised by the network analyzer 27.

The load characteristics may be given in terms of the dynamic admittance $Y_T$, a sign-reversed value of the admittance $-Y_T$, the dynamic impedance $Z_T$, and a sign-reversed value of the impedance $-Z_T$, the dynamic reflection coefficient $\Gamma_T$. As pointed out hereinabove, the equivalent admittance $Y_L$, the equivalent impedance $Z_L$, and reflection coefficient $\Gamma_L$ are respectively equal to the sign-reversed dynamic admittance and impedance and the inverse value of the dynamic reflection coefficient.

The output power $P_{out}$ is given by subtracting the reading of the second power monitor 31 from that of the third one 32. By the use of a fourth power monitor 46 connected to the second and third power monitors 31 and 32 to provide the output power $P_{out}$, it is possible to manually or otherwise control the phase shifter and second attenuator 23 and 24 as indicated at 47 to keep the output power $P_{out}$ constant and to make the X-Y recorder 28 automatically record those output load impedance characteristics for several values of the output power $P_{out}$ which are very useful in practical applications.

What is claimed is:

1. A method for measuring, by the use of a microwave signal, load characteristics of a microwave transistor having an input and an output terminal pair, comprising the steps of: branching a first and a second signal from said microwave signal; adjusting the amplitude and phase of said second signal to provide an adjusted signal; supplying said first signal through an input tuner network to said input terminal pair; supplying said adjusted signal to said output terminal pair simultaneously with supplying said first signal to said input pair to make said transistor produce a reflected signal across said output terminal pair; and measuring said adjusted signal and said reflected signal.

2. A method as claimed in claim 1: further comprising the steps of;
    measuring the electric power of said adjusted signal and reflected signal to provide a difference therebetween; and
    keeping said difference substantially constant on carrying out the first mentioned measuring step.

3. An apparatus for measuring, by the use of a microwave signal, load characteristics of a microwave transistor having an input and an output terminal pair, comprising: means for branching a first and a second signal from said microwave signal; an input tuner connected to said input terminal pair; means for supplying said first signal through said input tuner network to said input terminal pair; means for adjusting the amplitude and phase of said second signal to produce an adjusted signal; a measuring instrument; and means for supplying said adjusted signal to said output terminal pair through said measuring instrument simultaneously with application of said first signal to said input terminal pair to make said transistor produce a reflected signal across said output terminal pair; said measuring instrument being capable of measuring said adjusted signal and said reflected signal.

4. A device as claimed in claim 3, further comprising means for measuring the electric power of said adjusted and reflected signals to provide a difference therebetween.

* * * * *